United States Patent [19]

Canzano

[11] Patent Number: 4,553,085
[45] Date of Patent: Nov. 12, 1985

[54] COAXIAL CABLE TESTER DEVICE

[76] Inventor: Domenic A. Canzano, 32 Hobson St., Lawrence, Mass. 01841

[21] Appl. No.: 494,377

[22] Filed: May 13, 1983

[51] Int. Cl.⁴ ............................................. G01R 31/02
[52] U.S. Cl. ........................................ 324/51; 324/66
[58] Field of Search ....................... 340/650, 651, 652; 179/175.3 F; 324/51, 52, 66, 133

[56] References Cited

U.S. PATENT DOCUMENTS

| 3,217,244 | 11/1965 | Glover | 324/51 |
| 3,982,180 | 9/1976 | Vaiden | 324/51 |
| 4,399,400 | 8/1983 | Rockwell | 324/66 X |

FOREIGN PATENT DOCUMENTS

| 652506 | 3/1979 | U.S.S.R. | 324/66 |
| 739439 | 6/1980 | U.S.S.R. | 324/66 |

Primary Examiner—Stanley T. Krawczewicz
Assistant Examiner—Jose M. Solis
Attorney, Agent, or Firm—Joseph S. Iandiorio; William E. Noonan

[57] ABSTRACT

A coaxial cable tester device includes a transmitter unit and a receiving unit. The transmitter unit includes first and second coaxial connectors, each having a center conductor and a ground conductor. There are means for isolating the ground conductors of the first and second connectors from each other. There is a power supply having first and second terminals, one connected to the center conductors and the other to the ground conductors of the first and second connectors. A short indicator circuit is connected across the terminals; the short indicator circuit includes a short switch and an indicator device in series. The receiver unit includes third and fourth coaxial connectors, each having a center conductor and a ground conductor. There are means for isolating the ground conductors of the third and fourth connectors. A first switch is connected between the ground conductors of the third and fourth connectors and a second switch is connected between the center conductors of the third and fourth connectors. A first indicator means is connected between the center and ground conductors of the third connector and second indicator means are connected between the center and ground conductors of the fourth connector.

10 Claims, 5 Drawing Figures

COAXIAL CABLE TESTER DEVICE

FIELD OF INVENTION

This invention relates to a coaxial cable tester device, and more particularly to a device which detects shorts and opens and indicates the defective conductor.

BACKGROUND OF INVENTION

Coaxial cable is being used ever more extensively in areas such as audio, video, data transmission, and microwave circuits. Coaxial cables can be damaged due to manufacturing errors, mishandling or accident so that the center conductor or ground conductor or both are broken or are shorted together. When a problem occurs suggesting that a cable may be defective, the initial approach is for a person to connect the center conductor to the ground conductor or either of them to the like conductor of an associated cable and then go to the other end of the cable and perform a continuity check. The person involved is usually highly skilled, such as an electrician or technician, so the cost of troubleshooting in this manner can be quite expensive. In addition, even if a fault is detected in this manner, it is not known in which of the conductors the fault has occurred unless a second or even third test is made; each test requires the tester to travel back and forth between the distant ends of the cable. For example, a discontinuity in test of a center conductor to ground conductor of a single cable indicates there is a fault in one of these conductors. To determine which of the conductors has the fault, a connection is made between the center conductor of the bad cable and another cable and a continuity check is made. If the test shows a fault then it can be determined that the center conductor of the first cable is defective; if not, the defect is in the ground conductor of the first cable and this is confirmed by connecting the ground conductors of the two cables and finding continuity. If the ground and center conductors are both defective, then the testing becomes even more complex and time consuming. One attempt to automate the testing uses an electronic device which is quite large and complex to use, in the nature of an oscilloscope and costs thousands of dollars. Because of its size and cost, it is not practical to supply the cable installers with such devices in order to prevent installation of defective cable. Rather, these devices are more often used to detect faults when a problem arises after installation.

SUMMARY OF INVENTION

It is therefore an object of this invention to provide an improved coaxial cable tester device which is simple and easy to use.

It is a further object of this invention to provide such a coaxial cable tester device which is small, compact, light weight and easily carried in a pocket or a tool box.

It is a further object of this invention to provide such a coaxial cable tester device which is inexpensive enough to permit their issuance to and use by installation electricians and technicians.

It is a further object of this invention to provide such a coaxial cable tester device which quickly and easily determines whether a cable is defective, whether the defect is an open or a short and in which conductor the defect occurs.

It is a further object of this invention to provide such a coaxial cable tester device which includes a transmitter unit which functions to detect shorts, a receiver unit which functions to detect opens, and to indicate in which conductor a fault occurs.

It is a further object of this invention to provide such a coaxial cable tester device which can determine whether a signal is present on a cable.

It is a further object of this invention to provide such a coaxial cable tester device which includes a receiver unit which can be used to detect signals provided directly by the system into which the coaxial cables are connected.

The invention features a coaxial cable test device including a transmitter unit and a receiver unit. The transmitter unit includes first and second coaxial connectors, each having a center conductor and a ground conductor. There are means for isolating the ground conductors of the first and second connectors from each other. A power supply has first and second terminals, one connected to the center conductors and the other to the ground conductor of the first connector. A short indicator circuit is connected across the terminals. The short indicator circuit includes a short switch and an indicator device in series.

The receiver unit includes third and fourth coaxial connectors, each having a center conductor and a ground conductor. There are means for isolating the ground conductors of the third and fourth connectors. A first switch is connected between the ground connectors of the third and fourth connectors and a second switch is connected between the center conductors of the third and fourth connectors. There are first indicator means connected between the center and ground conductors of the third connector and second indicator means connected between the center and ground conductors of the fourth connector.

In a preferred embodiment, the transmitter unit and receiver unit are used together. The means for isolating the ground conductors in the transmitter unit may include insulation mounting means associated with the first and second connectors. The means for isolating may also include a diode interconnected between the ground conductors of the first and second connectors in the transmitter unit. The means for isolating the ground conductors in the receiver unit may include insulating mounting means associated with the third and fourth connectors. The insulation mounting means may include the use of insulating transmitter and receiver housings. The short indicator in the transmitter unit is preferably a visual indicator such as a light. The first and second indicators in the receiving unit are also preferably visual indicators such as lights.

DISCLOSURE OF PREFERRED EMBODIMENT

Other objects, features and advantages will occur from the following description of a preferred embodiment and the accompanying drawings, in which.

Figure 1:
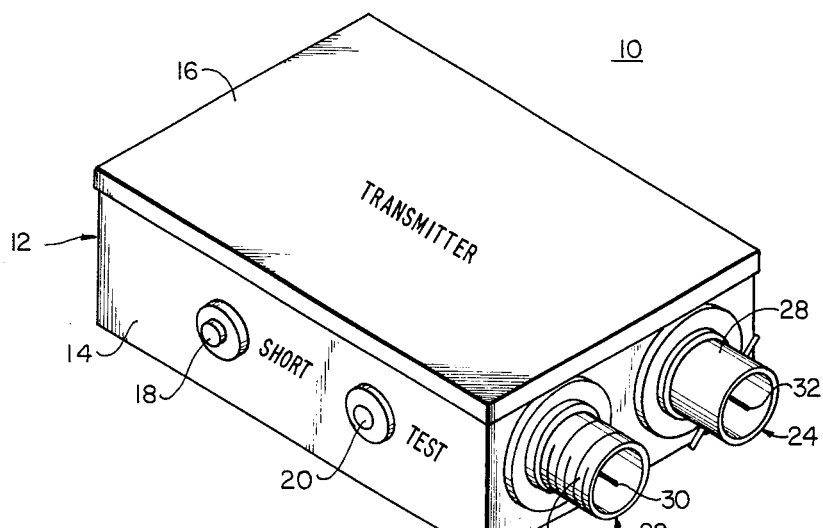
FIG. 1 is an axonometric view of a transmitter unit of the coaxial cable tester device according to this invention.

There is shown in FIG. 1 a transmitter 10 used in the coaxial cable tester device of this invention. Transmitter 10 includes a box 12 having a base 14 and cover 16 which houses the transmitter circuitry. Mounted externally on base 14 is a momentary switch 18 and an indicator which, in this case, is a visual indicator in the form of light 20. It may as well be an audio indicator such as a buzzer or a bell. Also mounted on the outside of base 14 is a pair of coaxial connectors 22 and 24. Connectors 22 and 24 include a ground conductor 26, 28 and a center conductor 30, 32 respectively. Typically, but not necessarily, the connectors 22 and 24 may be differentiated, for example by having one be a threaded connector such as shown at connector 22 and the other being a bayonet connector such as shown at 24, but other means may be used to distinguish them.

In operation, the cables may be installed on connectors 22 and 24 one at a time. After the first cable is installed, for example on connector 22, momentary switch 18 is actuated. If light 20 is energized then there is no short in that cable. If light 20 does not light, then there is a short in the cable. If there is a short in the first cable, the first cable will be removed from connector 22 before the second cable is installed on connector 24 so as not to confuse the test procedure. If the first cable installed on connector 22 has no short, it may remain installed on connector 22. After installation of the second cable on connector 24, the test may be run again by pressing momentary switch 18 and observing light 20.

Figure 2:
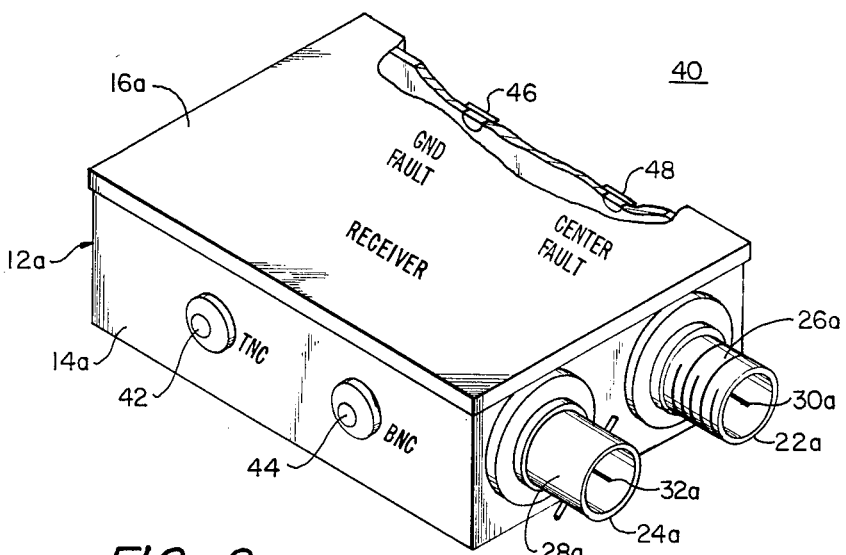
FIG. 2 is an axonometric view a receiving unit of the coaxial cable tester device according to this invention with portions broken away to show switches.

The coaxial cable tester device of this invention also includes a receiver unit 40, FIG. 2, including a box 12a having a base 14a and a cover 16a similar to that of transmitter 10. Also mounted on base 14a is a pair of connectors 22a and 24a similar in all respects to connectors 22 and 24 on transmitter unit 10, FIG. 1.

The receiver circuitry in box 12a includes a pair of indicators, audio, visual or otherwise, such as lights 42 associated with the threaded null connector (TNC) 22a and the light 44 associated with the bayonet null connector (BNC) 24a. There are also a pair of momentary switches, the ground fault switch 46 and the center fault switch 48.

In operation, the cable is installed on each of connectors 22a and 24a and there is a signal on each of the cables in the range of 3.5 to 9 volts. Preferably this voltage is obtained from the output of transmitter 10, as will be explained in connection with the discussion of the schematics in FIGS. 4 and 5, but it may also be obtained from signals provided by the system into which the coaxial cables are connected. Receiver 40 checks for breaks or open circuits in the cables as opposed to testing for shorts in the case of transmitter 10. In addition, receiver 40 can determine which of the conductors, the center conductor or the ground conductor, in which cable contains the break. With a cable installed on each of connectors 22a and 24a, if both lights 42 and 44 energized, that indicates that each of the cables has continuity and contains no breaks or open circuits. However, if one of the lights 42 and 44 is not lit, for example if light 42 TNC is not lit, that indicates that cable connected to 22a has a break in it. It can now be determined whether the break is in the ground conductor or the center conductor by pushing one or the other of switches 46 and 48. If you press switch 46 and light 42 then becomes energized, that indicates that the fault in the cable installed on connector 22a is a ground fault; if light 42 is not energized at this time then the suspicion is clear that the fault is in the center conductor. This can be ascertained by pressing momentary switch 48. At this point, light 42 should definitely light indicating that the cable connected to 22a has a fault in its center conductor.

Figure 3:
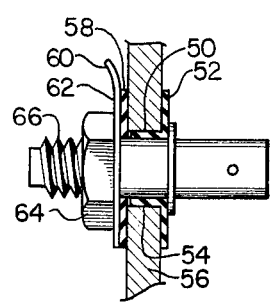
FIG. 3 is an enlarged detail view showing the insulating mounting of a coaxial connector.

It is necessary that the ground conductors 26, 28 in transmitter 10 and 26a, 28a in receiver 40 by isolated from one another. This is accomplished in FIGS. 1 and 2 by the fact that the base 14 and 14a of each of the units is an electrically non-conducting material, for example a plastic. If that is not the case, then each of the connectors must be insulated, as indicated in FIG. 3, where the coaxial connector illustrated as connector 22 is received in the insulating collar 50 of washer 52 fitted in hole 54 of electrically conducting box or other mounting 56. Another insulating washer 58 on the inside of box 56 completes the insulation mounting. Electrical connection to the ground conductor is made through lug 60 of conductor washer 62 and the entire assembly is held in place by a threaded nut 64 which engages with the threaded area 66 on the inner end of connector 22.

Figure 4:
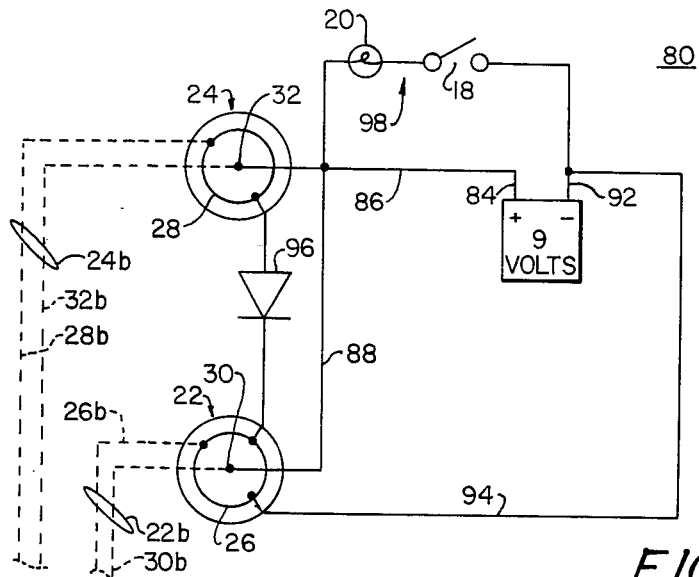
FIG. 4 is a schematic diagram of the transmitter of FIG. 1.
Figure 5:
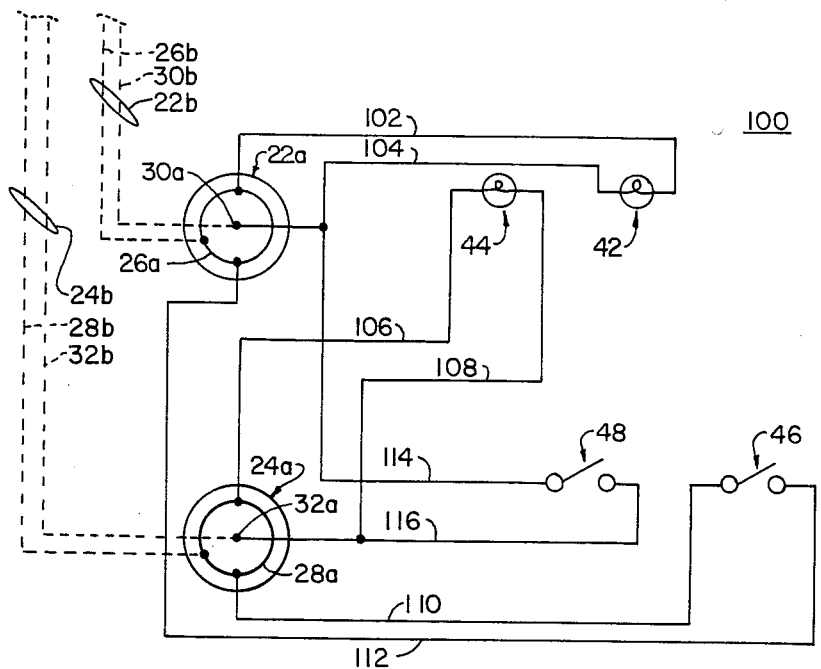
FIG. 5 is a schematic diagram of the receiver of FIG. 2.

Transmitter circuit 80, FIG. 4, having a power supply, 9-volt battery 82, with one of its terminals, e.g. positive terminal 84, interconnected through line 86 with the center conductor 32 of connector 24 and through line 88 with the center conductor 30 of connector 22. Negative terminal 92 of battery 82 connects via line 94 to the ground conductor 26 of connector 22 and then through isolation diode 96 to ground conductor 28 of connector 24. A short indicator circuit 98 including light 20 and switch 18 is connected across the battery terminals in parallel with the center conductors and ground conductors such as cable 24b having center conductor 32b and ground conductor 28b and cable 22b having ground conductor 26d and center conductor 30d. Transmitter unit 80 and receiver 100 are typically interconnected with a cable or cables between connectors 22 and 22a and connectors 24 and 24a.

In operation, momentary switch 18 is closed. If there is no short in the cable, light 20 will light. If there is a short between the center conductor and the ground conductor of the cable installed on connector 24, then a circuit is completed between the center conductor 32 and ground conductor 28 which shunts switch 18 and light 20 and prevents light 20 from being energized when switch 18 is closed. The same test may of course be made with respect to connector 22; in fact, tests can be made with a cable installed on each of connectors 22 and 24. As previously indicated, the ground conductors of each of these connectors is isolated either by insulating mountings as shown in FIG. 3 or by the fact that the box 14 or 14a is made of insulating material as in FIGS. 1 and 2. In addition, to guard against ground loops caused by interconnection of the grounds at a distant location, for example as may be the case when both cables are interconnected with a remote system with a common ground, diode 96 is provided. Receiver 40 includes a receiver circuit 100, FIG. 5. Light 42 associated with connector 22a is connected via lines 102 and 104 to the ground conductor 26a and center conductor 30a, respectively, of connector 22a. Light 44 associated with connector 24a is connected via lines 106 and 108 to ground conductor 28a and center conductor 32a, respectively, of connector 24a. The ground fault momentary switch 46 is connected via lines 110 and 112 between the ground conductor 28a of connector 24a and the ground conductor 26a of connector 22a. Center fault momentary switch 48 is connected via lines 114 and 116 across the center conductor 30a of connector 22a and the center conductor 32a of connector 24a.

In operation with the coaxial cable 22b installed on connector 22a and coaxial cable 24b installed on connector 24a, each of the cables can be tested for continuity and openss. There is a signal provided on each of the cables in the range of 3.5 to 9 volts which may come directly from a computer system or other system to which the cables 22b and 24b are connected or more typically may be provided from battery 82 in transmitter 80. With both cables installed and carrying signals, lights 42 and 44 are viewed. If they are both energized, that means that each of the cables is continuous and that there are no breaks or open circuits. For in that case, the signal appearing between the center conductor and ground conductor of each of the connectors 22a and 24a is provided to energize its respective light 42 and 44.

If there is a break in one of the cables, for example cable 22 attached to connector 22a, then light 42 will not be lit. To determine whether the break is in the center conductor 30b or the ground conductor 26b, either switch 46 or 48 may be actuated. For example, first actuating ground fault switch 46 interconnects the ground conductors 26a and 28, and the ground conductors of the cables 22b and 24b. If light 42 now lights, that is an indication that its ground contained the fault; if light 42 does not light at this time, then that is an indication that its center conductor contains the fault. This can be confirmed by releasing switch 46 and actuating switch 48 which interconnects the center conductors of cables 22b and 24b If now light 42 lights, that confirms that the break was in the center conductor of cable 22b. In a similar fashion, a fault occurring on cable 24b can be analyzed.

Other embodiments will occur to those skilled in the art and are within the following claims:

What is claimed is:

1. A coaxial cable tester device comprising:
a transmitter unit including first and second coaxial connectors, each having a center conductor and a ground conductor; means for isolating the ground conductors of said first and second connectors from each other; a power supply having first and second terminals, one connected to said center conductors and the other to said ground conductor of said first connector; and a short indicator circuit connected across said terminals, said short indicator circuit including a short switch and an indicator device in series;
a receiver unit including third and fourth coaxial connectors, each having a center conductor and a ground conductor; means for isolating the ground conductors of said third and fourth connectors; a first switch connected between said ground conductors of said third and fourth connectors; a second switch connected between said center conductors of said third and fourth connectors; first indicator means connected between the center and ground conductors of said third connector; and second indicator means connected between the center and ground conductors of said fourth connector.

2. The coaxial cable tester device of claim 1 in which said means for isolating said ground conductors in said transmitter unit includes insulation mounting means associated with said first and second connectors.

3. The coaxial cable tester device of claim 1 in which said means for isolating said ground conductors in said transmitter unit includes a diode interconnected between said ground conductors of said first and second connectors.

4. The coaxial cable tester device of claim 1 in which said means for isolating said ground conductors in said receiver unit includes insulation mounting means associated with said third and fourth connectors.

5. The coaxial cable tester device of claim 2 in which said insulation mounting means includes an insulating transmitter housing.

6. The coaxial cable tester device of claim 4 in which said insulation mounting means includes an insulating receiver housing.

7. The coaxial cable tester device of claim 1 in which said short indicator in said transmitter unit is a light.

8. The coaxial cable tester device of claim 1 in which said first and second indicators in said receiver unit are lights.

9. A coaxial cable tester device comprising: a transmitter unit including first and second coaxial connectors, each having a center conductor and a ground conductor; means for isolating the ground conductors of said first and second connectors from each other; a power supply having first and second terminals, one connected to said center conductors and the other to said ground conductor of said first connector; and a short indicator circuit connected across said terminals, said short indicator circuit including a short switch and an indicator device in series.

10. A coaxial cable tester device comprising: a receiver unit including third and fourth coaxial connectors, each having a center conductor and a ground conductor; means for isolating the ground conductors of said third and fourth connectors; a first switch connected between said ground conductors of said third and fourth connectors; a second switch connected between said center conductors of said third and fourth connectors; first indicator means connected between the center and ground conductors of said third connector; and second indicator means connected between the center and ground conductors of said fourth connector.

* * * * *